(12) United States Patent
Banerjee et al.

(10) Patent No.: US 11,663,068 B2
(45) Date of Patent: May 30, 2023

(54) WRITE ABORT ERROR DETECTION IN MULTI-PASS PROGRAMMING

(71) Applicant: Western Digital Technologies, Inc., San Jose, CA (US)

(72) Inventors: Amiya Banerjee, Bangalore (IN); Vinayak Bhat, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 182 days.

(21) Appl. No.: 16/915,617

(22) Filed: Jun. 29, 2020

(65) Prior Publication Data
US 2021/0406107 A1 Dec. 30, 2021

(51) Int. Cl.
*G06F 11/07* (2006.01)
*G11C 16/26* (2006.01)
*G11C 16/04* (2006.01)
*G11C 16/08* (2006.01)
*G11C 16/10* (2006.01)

(52) U.S. Cl.
CPC ........ *G06F 11/079* (2013.01); *G06F 11/0727* (2013.01); *G06F 11/0751* (2013.01); *G11C 16/0483* (2013.01); *G11C 16/08* (2013.01); *G11C 16/10* (2013.01); *G11C 16/26* (2013.01)

(58) Field of Classification Search
None
See application file for complete search history.

(56) References Cited

U.S. PATENT DOCUMENTS

| 8,054,684 | B2 | 11/2011 | Gorobets et al. |
| 9,384,839 | B2 | 7/2016 | Avila et al. |
| 9,460,780 | B2 | 10/2016 | Lee et al. |
| 9,530,491 | B1 * | 12/2016 | Uttarwar ............. G11C 11/5628 |
| 9,570,159 | B1 * | 2/2017 | Wakchaure ........... G06F 3/0619 |
| 9,653,154 | B2 | 5/2017 | Hsu et al. |
| 9,691,485 | B1 | 6/2017 | Kumar et al. |
| 9,817,593 | B1 * | 11/2017 | Inbar ..................... G06F 3/0679 |
| 9,978,456 | B2 | 5/2018 | Khandelwal et al. |
| 10,452,471 | B2 | 10/2019 | Shen et al. |

(Continued)

FOREIGN PATENT DOCUMENTS

WO 2016014303 A1 1/2016

OTHER PUBLICATIONS

PCT International Search Report and Written Opinion, PCT Application No. PCT/US2021/019211, dated Jun. 17, 2021.

*Primary Examiner* — Guerrier Merant
(74) *Attorney, Agent, or Firm* — Ravi Mohan; Rutan & Tucker, LLP

(57) ABSTRACT

A storage device may detect errors during data transfer. Upon detection of one or more data transfer errors, for example, the storage device can begin to scan pages within a plurality of memory devices for uncorrectable error correction codes. Once scanned, a range of pages within the plurality of memory devices with uncorrectable error correction codes associated with a write abort error may be determined. The stage of multi-pass programming achieved on each page within that range is then established. Once calculated, the previously aborted multi-pass programming of each page within the range of pages can continue until completion. Upon completion, normal operations may continue without discarding physical data location.

19 Claims, 10 Drawing Sheets

(56) References Cited

U.S. PATENT DOCUMENTS

| | | | |
|---|---|---|---|
| 2005/0144365 A1* | 6/2005 | Gorobets | G06F 11/1415 |
| | | | 711/E12.008 |
| 2011/0149651 A1* | 6/2011 | Gorobets | G11C 16/0483 |
| | | | 365/185.11 |
| 2013/0219107 A1 | 8/2013 | Lee et al. | |
| 2016/0125960 A1* | 5/2016 | Inbar | G11C 29/52 |
| | | | 714/719 |
| 2016/0141046 A1* | 5/2016 | Khandelwal | G11C 11/5628 |
| | | | 365/185.02 |
| 2016/0211014 A1* | 7/2016 | Lee | G11C 11/5628 |
| 2016/0240262 A1 | 8/2016 | Shah et al. | |
| 2017/0084328 A1* | 3/2017 | Hsu | G11C 11/5628 |
| 2017/0257118 A1* | 9/2017 | Goldenberg | H03M 13/1105 |
| 2018/0253240 A1 | 9/2018 | Alhussien et al. | |
| 2019/0108090 A1* | 4/2019 | Shen | G11C 11/5628 |

* cited by examiner

FIG. 6

| WL# | PROGRAM STAGE | PROGRAM ORDER | | | |
|-----|---------------|---------|---------|---------|---------|
| | | STRING 0 | STRING 1 | STRING 2 | STRING 3 |
| WL0 | FOGGY | 0 | 1 | 2 | 3 |
| WL1 | FINE | 5←4 | 7←6 | 9←8 | 11←10 |
| WL2 | FOGGY | 13 | 15 | 17 | 19 |
| WL2 | FINE | 12 | 14 | 16 | 18 |
| WL3 | FOGGY | 21 | 23 | 25 | 27 |
| WL3 | FINE | 20 | 22 | 24 | 26 |
| ... | ... | ... | ... | ... | ... |
| WL93 | FINE | 749 | 751 | 753 | 755 |
| WL94 | FOGGY | 748 | 750 | 752 | 754 |
| WL94 | FINE | 757←756 | 759←758 | 761←760 | 763←762 |
| WL95 | FOGGY | 764 | 765 | 766 | 767 |
| WL95 | FINE | | | | |

WRITE ABORT ERROR DETECTION IN MULTI-PASS PROGRAMMING

The present disclosure relates to storage systems. More particularly, the present disclosure relates to detecting write abort errors during multi-pass programming data transfers.

BACKGROUND

Storage devices are ubiquitous within computing systems. Recently, solid-state memory devices capable of nonvolatile storage of charge have become the predominant choice within various consumer electronics products. Popular types of solid-state memory devices include flash-type electrically erasable programmable read-only memory ("EEPROM"). These memory devices are typically NAND-based which can be erased and have new data written or "programmed" into memory cells.

In order to avoid various interference effects, many flash-based memory devices utilize a multi-pass programming scheme for programming a page of memory cells on a word line in parallel within the memory device. At a high-level, multi-pass programming schemes typically add charge to the memory cell and "push" the internal charge of the memory cell from a base, ground state to the desired voltage. Although many variations on multi-pass programming exist, almost all schemes share the trait that the memory cell will not be readable until the memory cell is completely written.

However, during normal operations, the storage device may experience an ungraceful shutdown ("UGSD") including a sudden loss of power that halts operations within the storage device without properly wrapping up all currently running operations. When a storage device is writing data to a memory device, an UGSD can cause a write abort error that interrupts the multi-pass programming process. This can lead to situations where particular memory cells have not had their internal charge increased, or "pushed" enough to yield a readable charge.

In many instances, the storage device may not have data indicating which memory cells (or respective pages) were being programmed at the time of the UGSD. Additionally, even when the storage device may contain control data indicating the affected memory pages, the exact stage of the multi-pass programming completed is often not known.

When faced with this situation, typical storage devices may process the problem in a few ways. First, the storage device may mark the block of memory containing the write-aborted pages as unusable, leading to decreased memory size, thus lowering the useful lifespan of the device. Second, the storage device may attempt to re-start the multi-pass programming which may lead to an incorrect selection of step within the multi-pass programming scheme, leading to the memory cell's charge to be increased or "pushed" too high causing over-programming errors that can often not be corrected, leading to data loss and leaving the memory cells unusable. Finally, a storage device may attempt to erase and re-program the affected blocks within the memory devices. However, the typical NAND-based flash memory device will be limited in how many times it may be re-written. Thus, erasing and re-programming can lower the overall useful lifespan of the storage device, often quantified as terabytes written ("TBW").

BRIEF DESCRIPTION OF DRAWINGS

The above, and other, aspects, features, and advantages of several embodiments of the present disclosure will be more apparent from the following description as presented in conjunction with the following several figures of the drawings.

FIG. 6 is a conceptual illustration of a staggered foggy/fine multi-pass programming order within a series of word lines with multiple strings in accordance with an embodiment of the invention;

Figure 1:
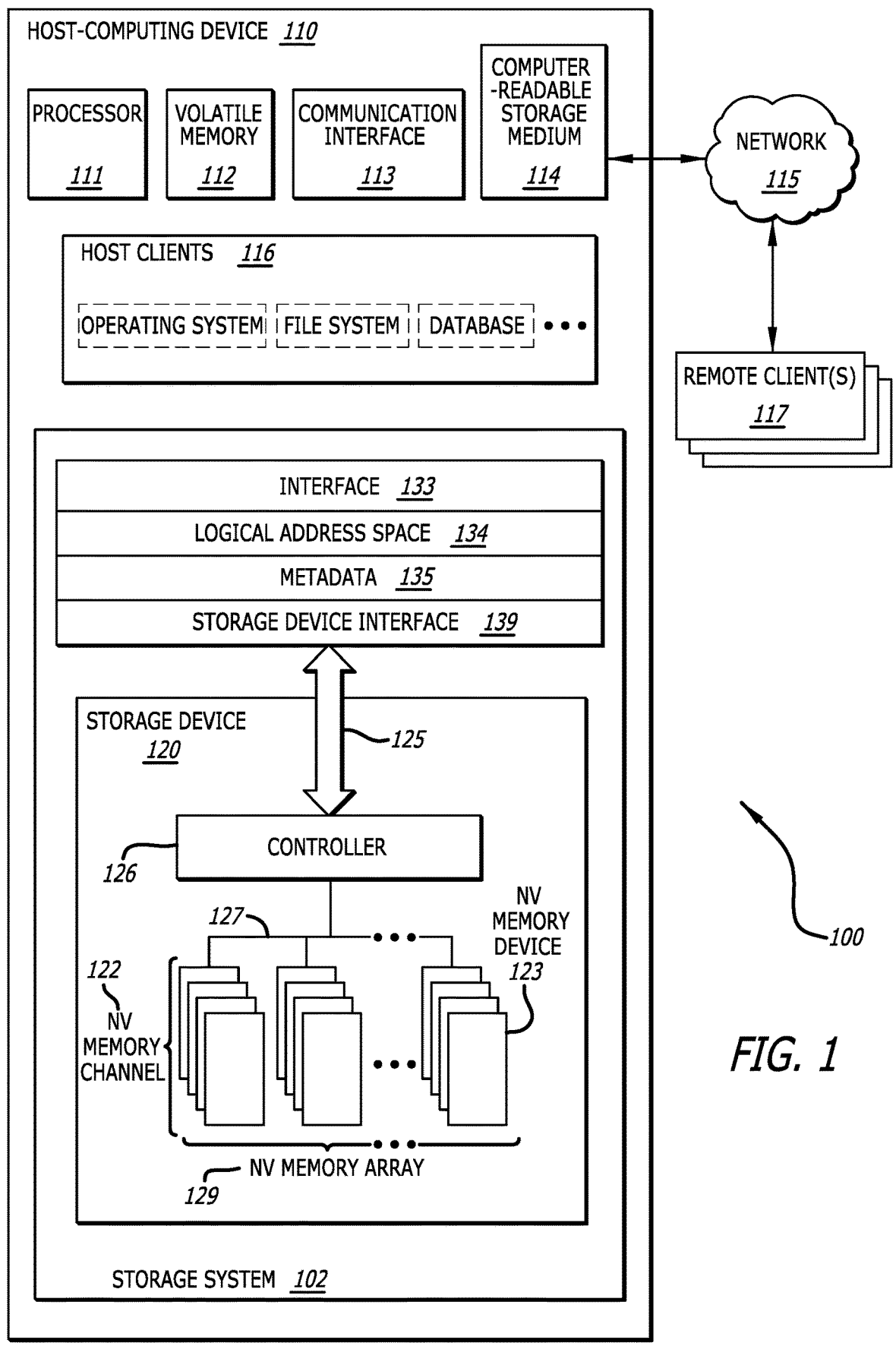
FIG. 1 is schematic block diagram of a host-computing device with a storage device suitable for write abort detections in accordance with an embodiment of the invention.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above systems and methods for effectively detecting and correcting write abort errors during multi-pass programming data transfers are described herein. Specifically, many embodiments utilize characteristics of a staggered data writing order designed to minimize interference to determine the location of pages of memory within blocks that have been affected by the write abort error caused by an ungraceful shutdown ("UGSD"). A range of pages can be determined which can then be scanned in more detail to determine the stage at which the multi-pass programming operations were halted. Based on this, various embodiments can continue the multi-pass programming until completion, thus lowering the likelihood of losing the data and discarding the memory which can increase the overall lifespan of the storage device. Additional embodiments are discussed in more detail below.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a schematic block diagram of a host-computing device 110 with a storage system 102 suitable for enhanced write-abort detections in accordance with an embodiment of the invention is shown. The write-abort detection system 100 comprises one or more storage devices 120 of a storage system 102 within a host-computing device 110 in communication via a controller 126. The host-computing device 110 may include a processor 111, volatile memory 112, and a communication interface 113. The processor 111 may include one or more central processing units, one or more general-purpose processors, one or more application-specific processors, one or more virtual processors (e.g., the host-computing device 110 may be a virtual machine operating within a host), one or more processor cores, or the like. The communication interface 113 may include one or more network interfaces configured to communicatively couple the host-computing device 110 and/or controller 126 of the storage device 120 to a communication network 115, such as an Internet Protocol (IP) network, a Storage Area Network (SAN), wireless network, wired network, or the like.

The storage device 120, in various embodiments, may be disposed in one or more different locations relative to the host-computing device 110. In one embodiment, the storage device 120 comprises one or more non-volatile memory devices 123, such as semiconductor chips or packages or other integrated circuit devices disposed on one or more printed circuit boards, storage housings, and/or other mechanical and/or electrical support structures. For example, the storage device 120 may comprise one or more direct inline memory module (DIMM) cards, one or more expansion cards and/or daughter cards, a solid-state-drive (SSD) or other hard drive device, and/or may have another memory and/or storage form factor. The storage device 120 may be integrated with and/or mounted on a motherboard of the host-computing device 110, installed in a port and/or slot of the host-computing device 110, installed on a different host-computing device 110 and/or a dedicated storage appliance on the network 115, in communication with the host-computing device 110 over an external bus (e.g., an external hard drive), or the like.

The storage device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the storage device 120 may be disposed on a peripheral bus of the host-computing device 110, such as a peripheral component interconnect express (PCI Express or PCIe) bus such, as but not limited to a NVM Express (NVMe) interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The host-computing device 110 may further comprise computer-readable storage medium 114. The computer-readable storage medium 114 may comprise executable instructions configured to cause the host-computing device 110 (e.g., processor 111) to perform steps of one or more of the methods disclosed herein. Additionally, or in the alternative, the buffering component 150 may be embodied as one or more computer-readable instructions stored on the computer readable storage medium 114.

A device driver and/or the controller 126, in certain embodiments, may present a logical address space 134 to the host clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the storage device 120 may maintain metadata 135, such as a logical to physical address mapping structure, to map logical addresses of the logical address space 134 to media storage locations on the storage device(s) 120. A device driver may be configured to provide storage services to one or more host clients 116. The host clients 116 may include local clients operating on the host-computing device 110 and/or remote host clients 117 accessible via the network 115 and/or communication interface 113. The host clients 116 may include, but are not limited to: operating systems, file systems, database applications, server applications, kernel-level processes, user-level processes, applications, and the like.

The device driver may be further communicatively coupled to one or more storage systems 102 which may include different types and configurations of storage devices 120 including, but not limited to: solid-state storage devices, semiconductor storage devices, SAN storage resources, or the like. The one or more storage devices 120 may comprise one or more respective controllers 126 and non-volatile memory channels 122. The device driver may provide access to the one or more storage devices 120 via any compatible protocols or interface 133 such as, but not limited to, SATA and PCIe. The metadata 135 may be used to manage and/or track data operations performed through the protocols or interfaces 133. The logical address space 134 may comprise a plurality of logical addresses, each corresponding to respective media locations of the one or more storage devices 120. The device driver may maintain metadata 135 comprising any-to-any mappings between logical addresses and media locations.

A device driver may further comprise and/or be in communication with a storage device interface 139 configured to transfer data, commands, and/or queries to the one or more storage devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The storage device interface 139 may communicate with the one or more storage devices 120 using input-output control (IO-CTL) command(s), IO-CTL command extension(s), remote direct memory access, or the like.

The communication interface 113 may comprise one or more network interfaces configured to communicatively couple the host-computing device 110 and/or the controller 126 to a network 115 and/or to one or more remote host clients 117. The controller 126 is part of and/or in communication with one or more storage devices 120. Although FIG. 1 depicts a single storage device 120, the disclosure is not limited in this regard and could be adapted to incorporate any number of storage devices 120.

The storage device 120 may comprise one or more non-volatile memory devices 123 of non-volatile memory channels 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 123 of the non-volatile memory channels 122, in certain embodiments, comprise storage class memory (SCM) (e.g., write in place memory, or the like).

While the non-volatile memory channels 122 is referred to herein as "memory media," in various embodiments, the non-volatile memory channels 122 may more generally comprise one or more non-volatile recording media capable of recording data, which may be referred to as a non-volatile memory medium, a non-volatile memory device, or the like. Further, the storage device 120, in various embodiments, may comprise a non-volatile recording device, a non-volatile memory array 129, a plurality of interconnected storage devices in an array, or the like.

The non-volatile memory channels 122 may comprise one or more non-volatile memory devices 123, which may include, but are not limited to: chips, packages, planes, die, or the like. A controller 126 may be configured to manage data operations on the non-volatile memory channels 122, and may comprise one or more processors, programmable processors (e.g., FPGAs), ASICs, micro-controllers, or the like. In some embodiments, the controller 126 is configured to store data on and/or read data from the non-volatile memory channels 122, to transfer data to/from the storage device 120, and so on.

The controller 126 may be communicatively coupled to the non-volatile memory channels 122 by way of a bus 127. The bus 127 may comprise an I/O bus for communicating data to/from the non-volatile memory devices 123. The bus 127 may further comprise a control bus for communicating addressing and other command and control information to the non-volatile memory devices 123. In some embodiments, the bus 127 may communicatively couple the non-volatile memory devices 123 to the controller 126 in parallel. This parallel access may allow the non-volatile memory devices 123 to be managed as a group, forming a non-volatile memory array 129. The non-volatile memory devices 123 may be partitioned into respective logical memory units (e.g., logical pages) and/or logical memory divisions (e.g., logical blocks). The logical memory units may be formed by logically combining physical memory units of each of the non-volatile memory devices 123.

The controller 126 may organize a block of word lines within a non-volatile memory device 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory device 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the host-computing device 110. A device driver may provide storage services to the host clients 116 via one or more interfaces 133. A device driver may further comprise a storage device interface 139 that is configured to transfer data, commands, and/or queries to the controller 126 over a bus 125, as described above.

Figure 2:
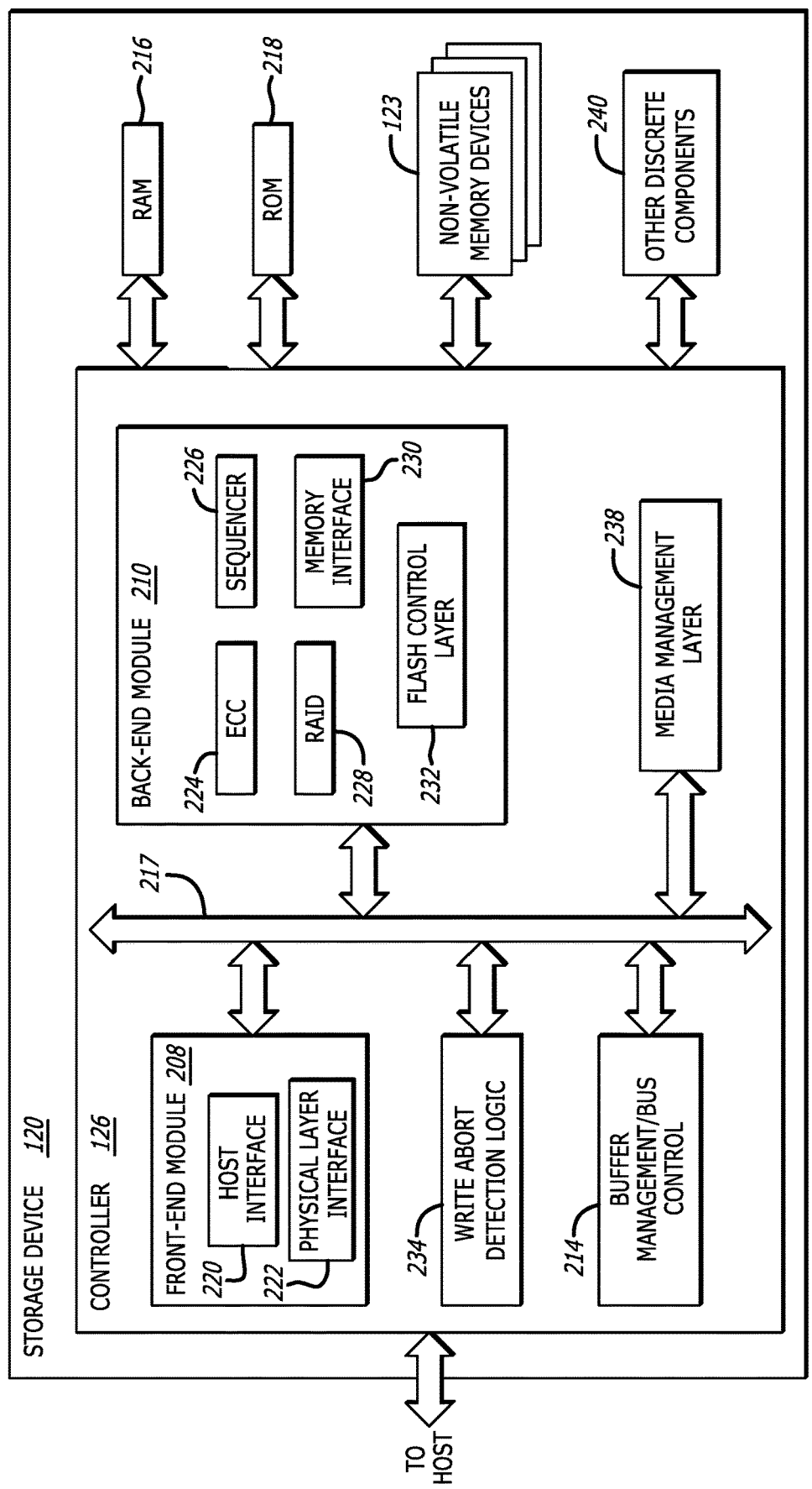
FIG. 2 is a schematic block diagram of a storage device suitable for write abort detections in accordance with an embodiment of the invention.

Referring to FIG. 2, a schematic block diagram of a storage device 120 suitable for enhanced write abort detections in accordance with an embodiment of the invention. The controller 126 may include a front-end module 208 that interfaces with a host, a back-end module 210 that interfaces with the non-volatile memory devices 123, and various other modules that perform various functions of the storage device 120. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 126 may include a buffer management/bus control module 214 that manages buffers in random access memory (RAM) 216 and controls the internal bus arbitration for communication on an internal communications bus 217 of the controller 126. A read only memory (ROM) 218 may store and/or access system boot code. Although illustrated in FIG. 2 as located separately from the controller 126, in other embodiments one or both of the RAM 216 and the ROM 218 may be located within the controller 126. In yet other embodiments, portions of RAM 216 and ROM 218 may be located both within the controller 126 and outside the controller 126. Further, in some implementations, the controller 126, the RAM 216, and the ROM 218 may be located on separate semiconductor dies. As discussed below, in one implementation, the submission queues and the completion queues may be stored in a controller memory buffer, which may be housed in RAM 216.

Additionally, the front-end module 208 may include a host interface 220 and a physical layer interface 222 that provides the electrical interface with the host or next level storage controller. The choice of the type of the host interface 220 can depend on the type of memory being used. Examples types of the host interfaces 220 may include, but are not limited to, SATA, SATA Express, SAS, Fibre Channel, USB, PCIe, and NVMe. The host interface 220 may typically facilitate transfer for data, control signals, and timing signals.

The back-end module 210 may include an error correction controller (ECC) engine 224 that encodes the data bytes received from the host and decodes and error corrects the data bytes read from the non-volatile memory devices 123. The back-end module 210 may also include a command sequencer 226 that generates command sequences, such as program, read, and erase command sequences, to be transmitted to the non-volatile memory devices 123. Additionally, the back-end module 210 may include a RAID (Redundant Array of Independent Drives) module 228 that manages generation of RAID parity and recovery of failed data. The RAID parity may be used as an additional level of integrity protection for the data being written into the storage device 120. In some cases, the RAID module 228 may be a part of the ECC engine 224. A memory interface 230 provides the command sequences to the non-volatile memory devices 123 and receives status information from the non-volatile memory devices 123. Along with the command sequences and status information, data to be programmed into and read from the non-volatile memory devices 123 may be communicated through the memory interface 230. A flash control layer 232 may control the overall operation of back-end module 210.

Additional modules of the storage device 120 illustrated in FIG. 2 may include a media management layer 238, which performs wear leveling of memory cells of the non-volatile memory devices 123. The storage device 120 may also include other discrete components 240, such as external electrical interfaces, external RAM, resistors, capacitors, or other components that may interface with controller 126. In alternative embodiments, one or more of the RAID modules 228, media management layer 238 and buffer management/bus controller 214 are optional components that may not be necessary in the controller 126.

Finally, the controller 126 may also comprise a write abort detection logic 234 that can be configured to locate, determine, and correct write abort errors that occur after a UGSD. The write abort detection logic 234 can be utilized by the controller 126 to attempt to salvage write abort affected memory within the non-volatile memory devices 123. This can include accessing control data stored within the storage device 120, scanning the non-volatile memory devices 123 for affected pages and determining the aborted stage of programming, and then continuing (or directing the controller 126 to continue) the interrupted multi-pass programming operations. In many embodiments, the write abort detection logic 234 can carry out processes similar to the processes discussed in more detail within FIGS. 7-10.

Figure 3:
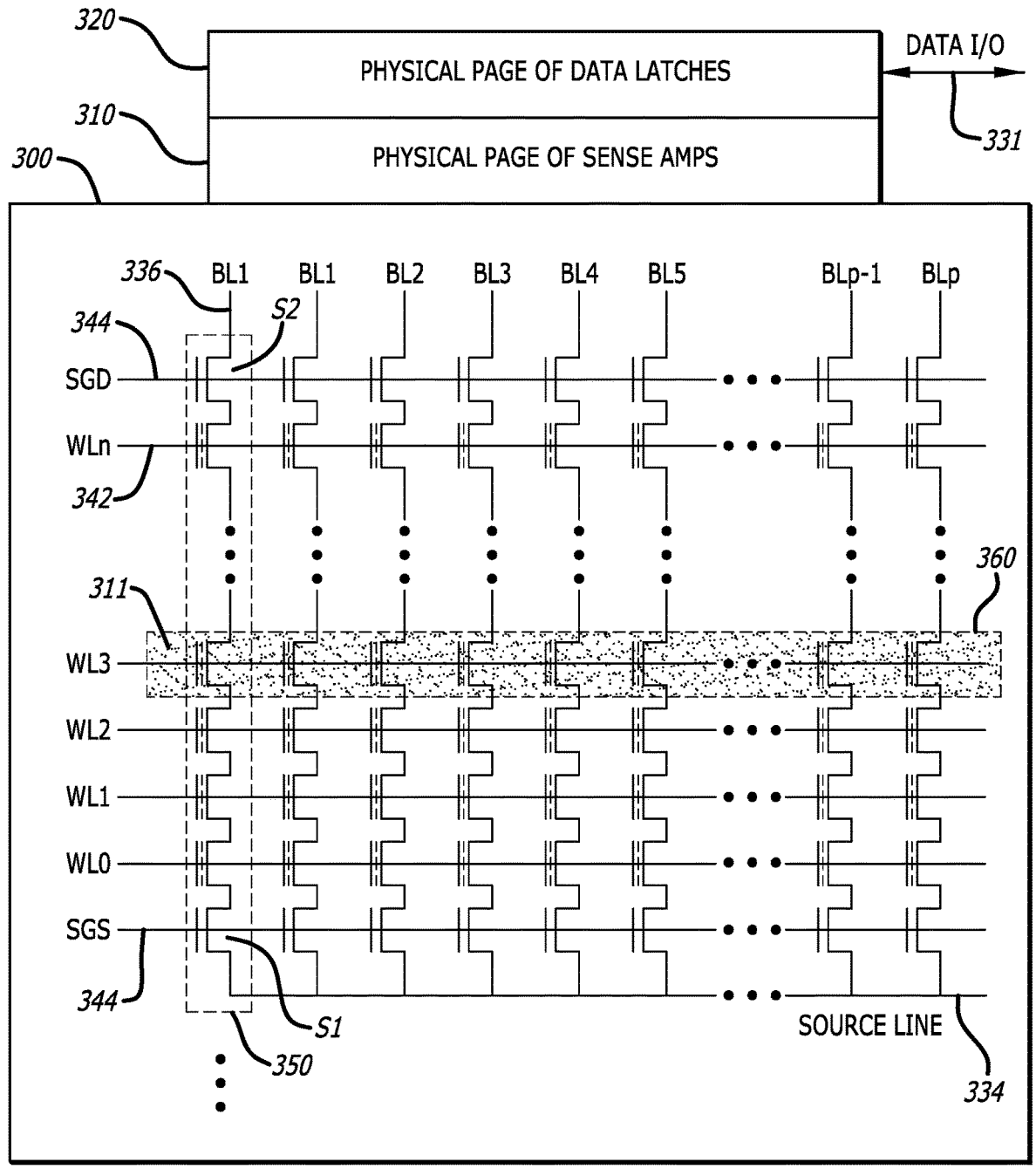
FIG. 3 is a conceptual illustration of a page of memory cells, organized for example in the NAND configuration, being sensed or programmed in parallel in accordance with an embodiment of the invention.

Referring to FIG. 3, a conceptual illustration of a page of memory cells, organized for example in the NAND configuration 300, being sensed or programmed in parallel in accordance with an embodiment of the invention is shown. FIG. 3 conceptually shows a bank of NAND strings 350 within a non-volatile memory device 123 of FIG. 1. A 'page' such as the page 360, is a group of memory cells enabled to be sensed or programmed in parallel. This is accomplished in the peripheral circuits by a corresponding page of sense amplifiers 310. The sensed results are utilized in latches within a corresponding set of data latches 320. Each sense amplifier can be coupled to a NAND string, such as NAND string 350 via a bit line 336. For example, the page 360 is along a row and is sensed by a sensing voltage applied to the control gates of the cells of the page connected in common to the word line WL3. Along each column, each memory cell such as memory cell 311 is accessible by a sense amplifier via a bit line 336. Data in the data latches 320 are toggled in from or out to the memory controller 126 via a data I/O bus 331.

The NAND string 350 can be a series of memory cells, such as memory cell 311, daisy-chained by their sources and drains to form a source terminal and a drain terminal respective at its two ends. A pair of select transistors S1, S2 can control the memory cell chain's connection to the external source via the NAND string's source terminal and drain terminal, respectively. In a memory array, when the source select transistor S1 is turned on, the source terminal is coupled to a source line 334. Similarly, when the drain select transistor S2 is turned on, the drain terminal of the NAND string is coupled to a bit line 336 of the memory array. Each memory cell 311 in the chain acts to store a charge. It has a charge storage element to store a given amount of charge so as to represent an intended memory state. In many embodiments, a control gate within each memory cell can allow for control over read and write operations. Often, the control gates of corresponding memory cells of each row within a plurality of NAND strings are all connected to the same word line (such as WL0. WL1 ... WLn 342). Similarly, a control gate of each of the select transistors S1, S2 (accessed via select lines 344 SGS and SGD respectively) provides control access to the NAND string via its source terminal and drain terminal respectively.

While the example memory device referred to above comprises physical page memory cells that store single bits of data, in most embodiments each cell is storing multi-bit data, and each physical page can have multiple data pages. Additionally, in further embodiments, physical pages may store one or more logical sectors of data. Typically, the host-computing device 110 (see FIG. 1) operating with a disk operating system manages the storage of a file by organizing the content of the file in units of logical sectors, which is typically in one or more units of 512 bytes. In some embodiments, a physical page may have 16 kB of memory cells being sensed in parallel by corresponding 16 kB of sense amplifiers via 16 kB of bit lines. An example logical sector assigned by the host has a size of 2 kB of data. Thus, a physical page can store 8 sectors if the cells are each configured to store 1 bit of data (SLC). For MLC, TLC, and QLC and other increased density structures, each cell can store 2, 3, 4 or more bits of data, and each physical page can store 16, 32, 64 or more logical sectors depending on the structure utilized.

One unique difference between flash memory and other types of memory is that a memory cell must be programmed from an erased state which is associated with no charge within the memory cell. This requires that the floating gate must first be emptied of charge prior to programming. Programming adds a desired amount of charge back to the floating gate. It does not support removing a portion of the charge from the floating to go from a more programmed state to a lesser one. Thus, new data cannot overwrite existing data and must be written to a previously unwritten or erased location. Furthermore, erasing all the charges from a floating gate can often take an appreciable amount of time. For that reason, it will be cumbersome and inefficient to erase cell by cell or even page by page. Therefore, in most embodiments, the array of memory cells is often divided into a large number of blocks. As is common in many flash-based memory systems, the block is the unit of erase. That is, each block contains the minimum number of memory cells that are erased in one action. This combined with the limited lifespans of memory cells within the flash memory increases the desire to limit the amount of erasing and programming occurring within the storage device.

Figure 4:
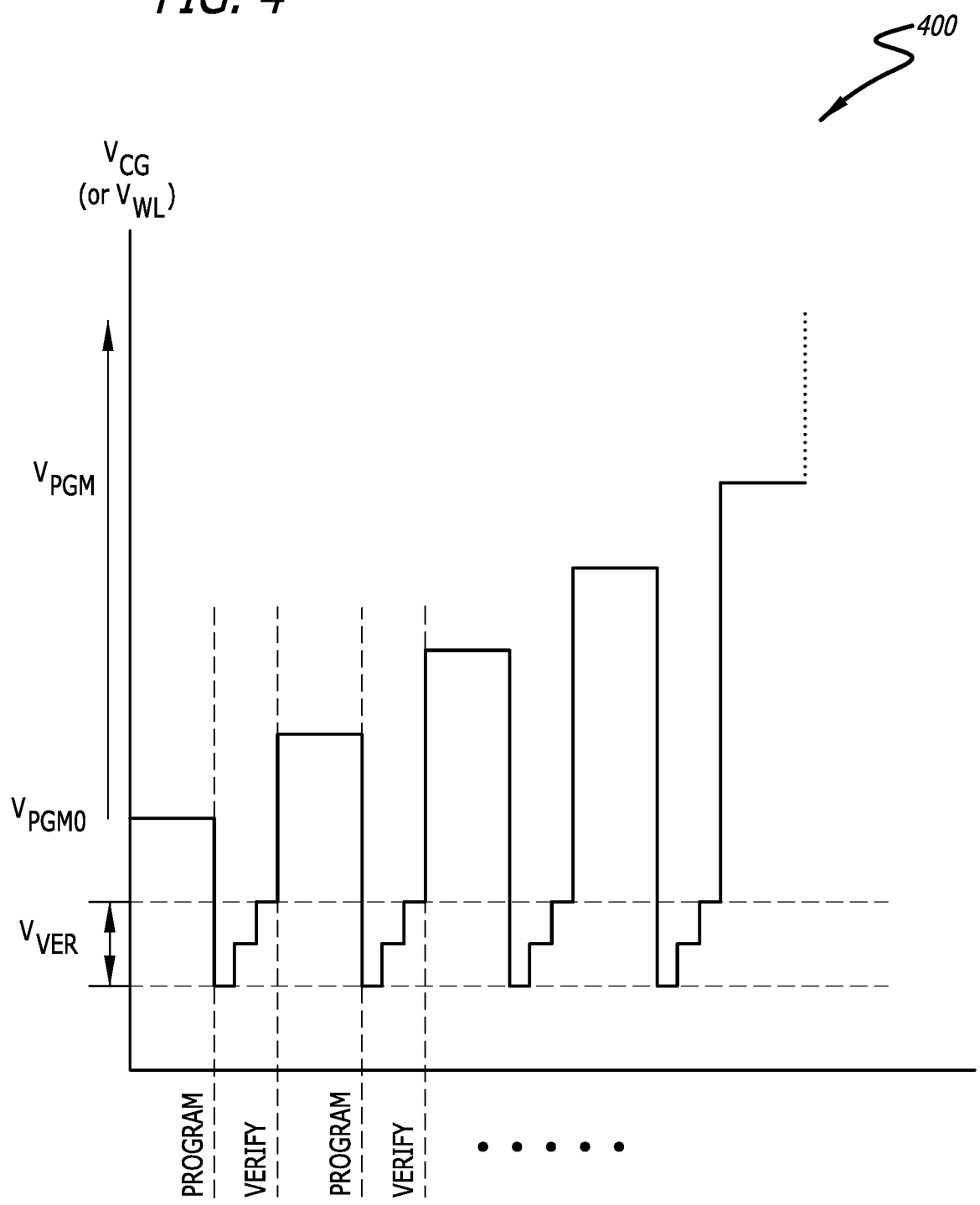
FIG. 4 is a conceptual illustration of a series of programming voltage pulses in the form of a staircase waveform being applied to a selected word line in accordance with embodiments of the invention.

Referring to FIG. 4, a conceptual illustration of a series of programming voltage pulses 400 in the form of a staircase waveform being applied to a selected word line in accordance with embodiments of the invention is shown. When a cell is programmed to a given state, it is often subject to successive programming voltage pulses to add incremental charges to the floating gate (seen within the "program" windows). In between programming pulses, the cell is often measured or verified to determine its source-drain current relative to a breakpoint level (seen within the "verify" windows).

In many embodiments, memory cell programming stops when it has been verified to reach the desired state ($V_{CG}$ or $V_{WL}$). The programming pulses used may have increasing period or amplitude in order to counter act the accumulating electrons programmed into the charge storage unit of the memory cell. The programming pulse level ($V_{PGM0}$) is often the initial pass and is then ramped up over successive programming passes through the program voltage levels (VPGM). A pulse that moves more charge into a memory cell than another is said to be coarser while a pulse that moves less charge is considered to comprise a finer granularity. Memory cell programming circuits generally apply a series of programming pulses to a selected word line. In this way, a page of memory cells whose control gates are connected to the word line can be programmed together. Whenever a memory cell of the page has been programmed to its target state, it can become program-inhibited while the other cells continue to be subject to further programming until all memory cells of the page have been program-verified.

The charge programmed into the storage element of one memory cell produces an electric field that can perturb the electric field of neighboring memory cells. Generally, an erased cell has no charge in its floating gate and has roughly the lowest threshold voltage. As the memory cell is increasingly programmed with more charges into the floating gate, its associated threshold voltage increases. Memory cells generally operate within a range of threshold voltages, often called a threshold window. The threshold window can be partitioned into a plurality of subranges or bands of threshold voltages, each representing a memory state. For field-effect transistors with a floating gate, the charges programmed into the floating gate of a memory cell can determine its threshold voltage which in turn determines what memory state it is currently in. However, as the intercellular distance between memory cells is reduced, memory cells may begin to 'see' or otherwise be influenced by the charges programmed into the floating gates of its physical neighbors. Thus, a memory cell may register as having more charge than it actually has, creating a virtual effect that increases its threshold voltage.

If a memory cell is program-verified under a first field environment and later is read again under a second, different field environment created from neighboring cells being subsequently programmed with different charges, the read accuracy may be affected. This is what is referred to as the "Yupin Effect" which is a disturb due to a coupling between neighboring floating gates. With ever higher integration in semiconductor memories, the perturbation of the electric field due to the stored charges between memory cells becomes increasing appreciable as the inter-cellular spacing shrinks.

The Yupin effect can be mitigated by minimizing the asymmetry in field environment for a cell due to its neighbors, between the time the cell has finished program-verify (i.e. programmed to its target state) to the time when its neighbors have finished programming. In this way, when the cell is being program-verified at its target state, it sees a first field environment due to its neighbors, and subsequently with the completion of programming of its neighbors, it can see a second field environment, and the difference between these two field environments are minimized. Here, the Yupin effect manifests as a program disturb that affects adjacent cells along a row and across bit lines (BL-BL Yupin effect) and along a column across word lines (WL-WL Yupin effect) within a memory array.

One method to reduce BL-BL Yupin effect is to adopt a multi-pass programming scheme for programming a page of memory cells on a word line in parallel. In a first programming pass, the memory cells targeted to the more programmed states (ones that will have their threshold voltages moved from an erased state at a lower end of the threshold window to a higher end) are initially programmed to a staging area near halfway of the threshold window. In subsequent programming passes, the memory cells are programmed from the staging area to their final target destinations. In this way, the difference between the first and second field environment seen by a memory cell is due to the threshold voltages of its neighbors not moving across the full extent but at most across half of the threshold window.

A conventional method of implementing the above-mentioned multi-pass programming is performed as a series of binary programs, in which at each programming pass the threshold window is binary divided and memory cells with target states belonging to the upper half of the binary divisions are programmed to the lower middle portion of the binary divisions. Each further programming pass iterates the binary division programming until in a final programming pass all memory cells of the page are programmed to their final destinations. Another popular method of multi-pass programming is a foggy/fine method that utilizes coarser programming to set a rough approximation of the charges (foggy step) and then utilizes more granular programming pulses to refine the memory states within the threshold window until the data has been stored successfully (fine step).

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages can span through a threshold window. When the threshold window is partitioned into multiple sub-ranges or zones of threshold voltages, each resolvable zone can be used to represent a different memory state for a memory cell. The multiple memory states can be coded by one or more binary bits. In SLC memory, each memory cell stores one bit of data. In MLC, TLC, and QLC memory structures, each memory cell can store 2, 3 or 4 bits of data. It is contemplated that further increased memory structures may be utilized in response to novel methods of resolving smaller zones within threshold windows.

Figure 5:
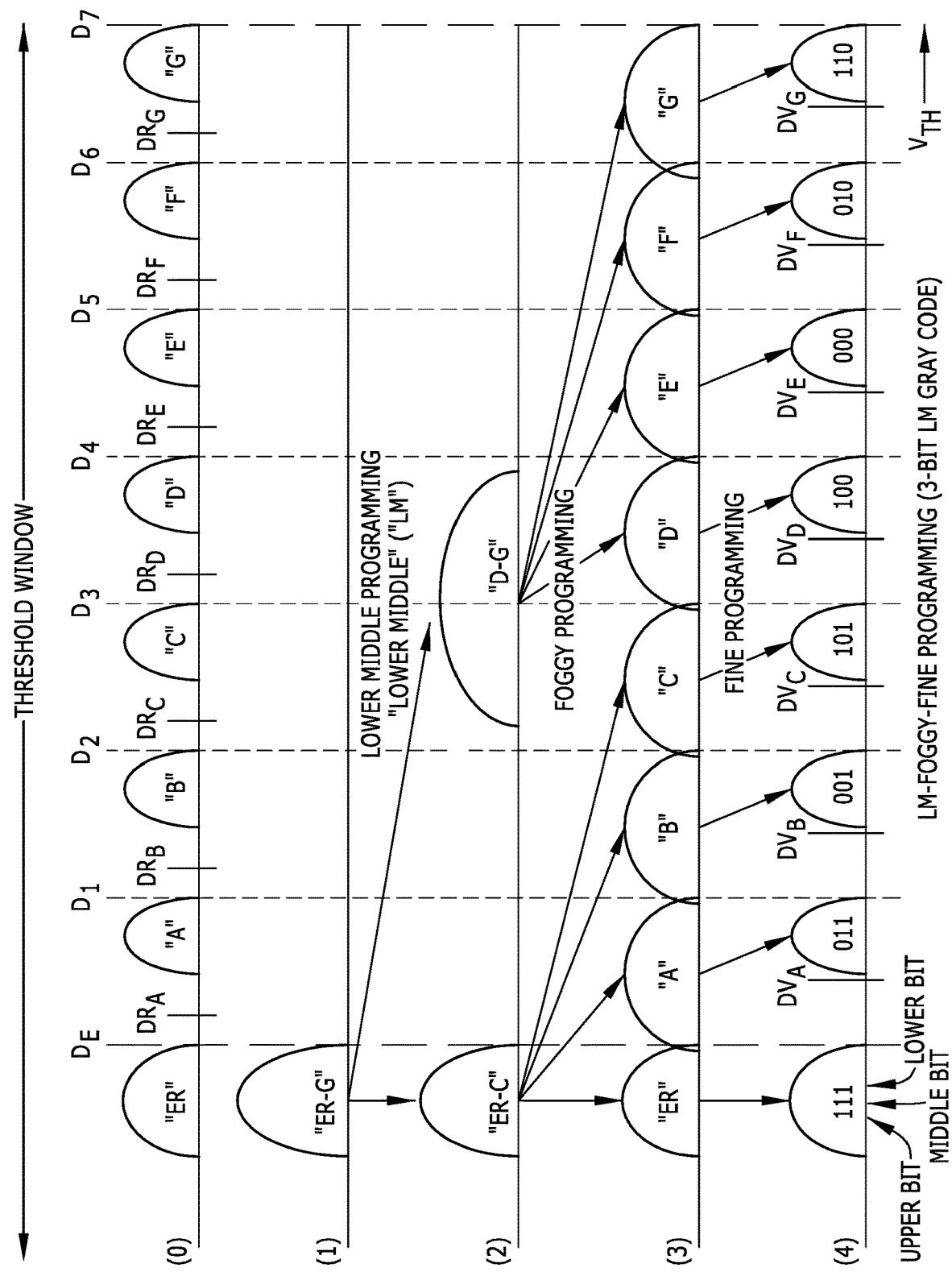
FIG. 5 is a conceptual illustration of a foggy/fine multi-pass programming scheme of a 3-bit memory cell in accordance with an embodiment of the invention.

Referring to FIG. 5, a conceptual illustration of a foggy/fine multi-pass programming scheme of a 3-bit memory cell in accordance with an embodiment of the invention is shown. FIGS. 5 at state (0)-5 at state (4) illustrate the programming of an 8-state memory programmed with a multi-pass foggy/fine programming method. Although this figure depicts a 3-bit TLC memory structure, it is contemplated and explained in more detail below that this method can be applied to QLC and other memory structures with higher bit densities per voltage threshold window. FIG. 5 at state (0) illustrates the typical threshold voltage distributions of an 8-state memory array. The possible threshold voltages of each memory cell can span a threshold window which is partitioned in this embodiment into eight regions by demarcation threshold voltage points $D_E$-$D_7$ to demarcate respectively eight possible memory states, "Er", "A", "B", "C", "D", "E", "F" and "G". "Er" is a ground state, which is considered an erased state and "A"-"G" are seven progressively programmed states. During a read, the eight states are demarcated by seven demarcation read points, $DR_A$-$DR_G$.

FIG. 5 at state (4) illustrates a representation of the eight possible memory states. Each of the eight memory states is represented by a triplet of "upper", "middle", and "lower" bits, namely "111", "011", "001", "101", "100", "000", "010" and "110" respectively. As is evident from FIG. 5 at state (3), the final programming pass results in only a small change in the threshold voltages of all the memory cells. This translates to smaller changes in the charge stored within each memory cell, thereby minimizing the Yupin effect.

FIG. 5 at state (1) indicates a memory cell that is suitable for programming via multi-pass foggy/fine programming. The "erased" state is labelled "Er-G" as it indicates that this threshold voltage may be increased to cover any of the potential voltage states within the memory cell. As shown in FIG. 5 at state (2), after the first round programming, each cell remains in the "erased" or "Er" state if the lower bit is "1" or programmed to a "lower middle" ("LM") state if the lower bit is "0". In other words, the "Er" or "ground" state is the "erased" state with a tightened distribution by having the deeply erased states programmed to within a narrow range of threshold values. The "lower middle" states may have a broad distribution of threshold voltages that are straddled between memory states such as "B" and "D". During programming, the "lower middle" state can be verified relative to a coarse breakpoint threshold level such as D.

FIG. 5 at state (3) illustrates that a second pass of a foggy/fine multi-pass programming method will program all the memory cells close to their destinations. These foggy voltage states include "Er" along with "A-G" as in FIG. 5 at state (0). This second pass programming is referred to as "foggy" as it is still performed coarsely with coarse programming pulses to increase speed but is often finer than that of the first LM pass. This is typically followed by a third "fine" programming pass, as shown in FIG. 5 at state (4), which trims the trailing edge of the threshold distribution of each state using still finer programming pulses. The verify threshold points for each pass can be dependent on the granularity of the programming pulses. Each placement is such that a memory cell will first be verified at the verify threshold before it can get over-programmed to a designated threshold value.

Since the fine programming only involves programming from within the proximity of the destination threshold voltage points, charges are not significantly altered from one round to another. This process helps to alleviate the BL-BL Yupin effect. As for 4-bit, 5-bit and higher bit foggy/fine multi-pass programming, the same principles can apply wherein an n-bit code would have n data pages with each page formed from every cell in a page contributing a given bit of the code. More importantly, programming from a lower (foggy) resolution to a higher (fine) resolution incurs moderate change in the charge of the cells, thereby limiting the amount of perturbation due to the Yupin effect among a page of memory cells.

It will be understood by those skilled in the art, that multi-pass programming typically includes multiple "passes" at each stage, and although FIG. 6 depicts 3 stages of programming, additional passes are often necessary for each stage. Indeed, in certain embodiments, programming a memory cell within either the foggy or fine step may require multiple, if not dozens of passes to achieve the proper voltage levels.

Referring to FIG. 6, a conceptual illustration of a staggered foggy/fine multi-pass programming order within a series of word lines with multiple strings in accordance with an embodiment of the invention is shown. As described previously, the Yupin effect may occur when changes in neighboring electric fields are made between readings of a memory cell. Various methods may be implemented to reduce these changes between programming and reading. FIG. 5 discussed the method of multi-pass programming utilizing a foggy and fine step that reduces changes between programming stages. Further reduction in field changes that may reduce WL-WL Yupin effects can include staggering the steps between foggy and fine programming among neighboring word lines as depicted in FIG. 6.

Typical multi-pass programming may attempt to sequentially program each cell and/or string by completing a fine programming pass directly after a foggy programming pass before moving onto another memory cell/string. However, by staggering the foggy and fine programming passes between memory strings and word lines, further reduction in neighboring field changes may be achieved.

FIG. 6 depicts a conceptual schematic of a storage device comprising a series of word lines, labeled WL0-WL95. Each word line includes 4 strings to be programmed (as STRINGS 0-3), and each string requires programming in both a foggy and fine stage. The staggered programming method depicted in FIG. 6 begins at STRING 0 on WL0 (0) which is programmed via one or more foggy programming passes. Instead of completing the fine programming pass of STRING 0 at WL0, the method instead continues to foggy program STRING 1 of WL0, followed by STRING 2 and STRING 3 of WL0 (1-3). At this stage of the method, all strings within WL0 are now foggy programmed. Instead of continuing to fine program each string within WL0, the method instead foggy programs STRING 0 of WL1 (4) before starting the fine programming of STRING 0 in WL0 (5). In this way, both of the nearest neighbors of STRING 0 of WL0 will have already had their foggy programming accomplished, thus reducing the potential changes to the electric field after fine programming which will further reduce the Yupin effect.

The method of programming depicted in FIG. 6 will continue to alternate between foggy programming further strings on WL1, and fine programming the remaining strings on WL0 (6-11). Once completed, the method will move on to begin alternating between foggy programming the strings on WL2, and fine programming the strings on WL1 (12-19). As shown in FIG. 6, the method will repeat the alternations between word lines for the remainder of the available word lines (20-767). As can be seen, when encountering the last word line, the method can simply finish the fine programming on the strings within the last word line (764-767).

One trade off of this method is that it may take longer to complete programming of each word line. As is understood by those skilled in the art, when utilizing foggy/fine multi-pass programming, data cannot be reliably read from a memory cell until it has completed the fine programming step. Ungraceful shutdowns, like those that may occur from power loss, can interrupt this method during the programming, creating strings and word lines that may not be completely programmed, and are thus unreliable and/or unusable. Thus, there is a need to be able to determine what stage of the multi-pass program was write aborted in order to continue the multi-pass programming and data transfer. Methods for detecting and correcting write abort errors in accordance with embodiments of the invention are described in more detail in the figures below.

Figure 7:
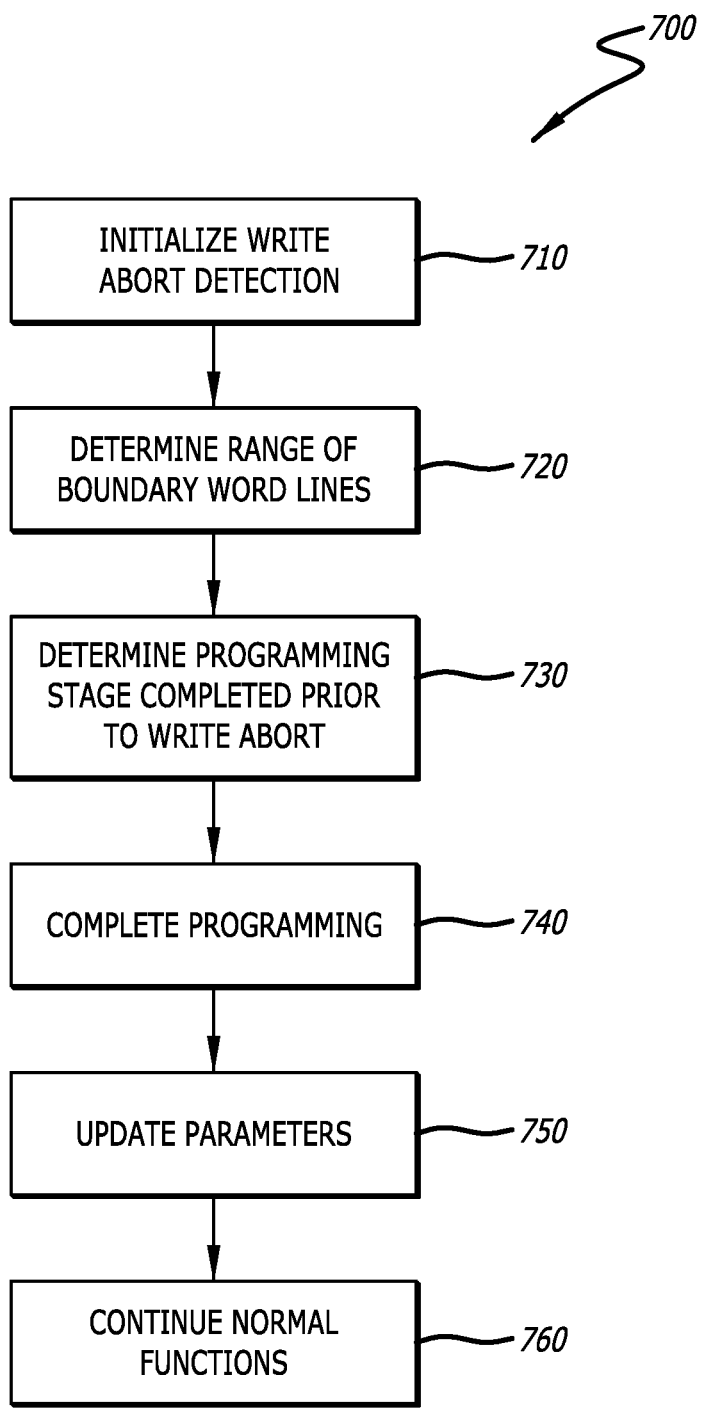
FIG. 7 is a high-level flowchart depicting a process for detecting and correcting write aborts during data transfers in accordance with an embodiment of the invention.

Referring to FIG. 7, a high-level flowchart depicting a process 700 for detecting and correcting write aborts during data transfers in accordance with an embodiment of the invention is shown. The process 700 can begin by initializing write abort detection (block 710). In many embodiments, this occurs in response to an ungraceful shutdown ("UGSD") or other power loss. Often, controllers within storage devices will have control data that indicates that an ungraceful shutdown has occurred prior to initialization. In response, a variety of embodiments of the controller may direct a plurality of processes, such as those within a write abort detection logic 234 (see FIG. 2) to execute the write abort detection process 700.

Upon initialization, the process 700 can evaluate internal memory devices to determine a range of boundary lines that have been affected by a write abort error (block 720). A more detailed explanation of the boundary line range detection method that occurs in a variety of embodiments is discussed in FIG. 8. Broadly, one or more boundary lines can be utilized to indicate a range of affected pages within the memory devices that have been directly affected by the write abort error(s). In a number of embodiments, boundary word lines can be determined by searching for pages that contain a UECC error indicating a write abortion. The pages within this range of word lines can be assumed to be affected and can therefore undergo a more detailed scan.

The process 700 can utilize the known boundary word lines to determine the completed stage of programming within the multi-pass programming process (block 730). A more detailed explanation of a method to determine completed multi-pass programming stages within memory devices in many embodiments of the invention is explained in more detail within the discussion of FIG. 9. An increased number of sense readings can be utilized to generate a reading that can be compared to a pre-configured value. That value can be configured to correspond to various stages of a memory cell during multi-pass programming. Through these comparisons, a determination of the aborted stage within the multi-pass programming process can occur.

Once the determination of when the write abort occurred during the multi-pass programming process, each affected page can be reprogrammed to complete the original, interrupted data transfer (block 740). A more detailed explanation of a programming completion process as contemplated in a variety of embodiments, is discussed in FIG. 10. Once the multi-pass programming has finished, the storage device can read each affected memory device to verify that the data has been stored correctly. In the event of any errors, the process 700 can notify the controller.

Upon completion of the aborted data transfer and verification, the process 700 may request to update parameters associated with the affected pages with the controller (block 750). In certain embodiments, this may indicate that the affected pages have passed data verification and no longer need to have any alerts, errors, or other negative indicators associated with the affected pages. It is contemplated that in some embodiments, the updating of parameters may occur prior to the reprogramming of the affected memory pages. By way of example and not limitation, the process 700 may update parameters to indicate that the affected memory pages can be unlocked or are otherwise ready for reprogramming. In further embodiments, parameters may be updated both prior to and after the reprogramming of the affected memory pages. The storage device may continue normal operations once the parameters have been sufficiently updated and the reprogramming has completed (block 760). In additional embodiments, the write abort detection process 700 would occur with little to no interaction between the host-computing device and the storage device.

Figure 8:
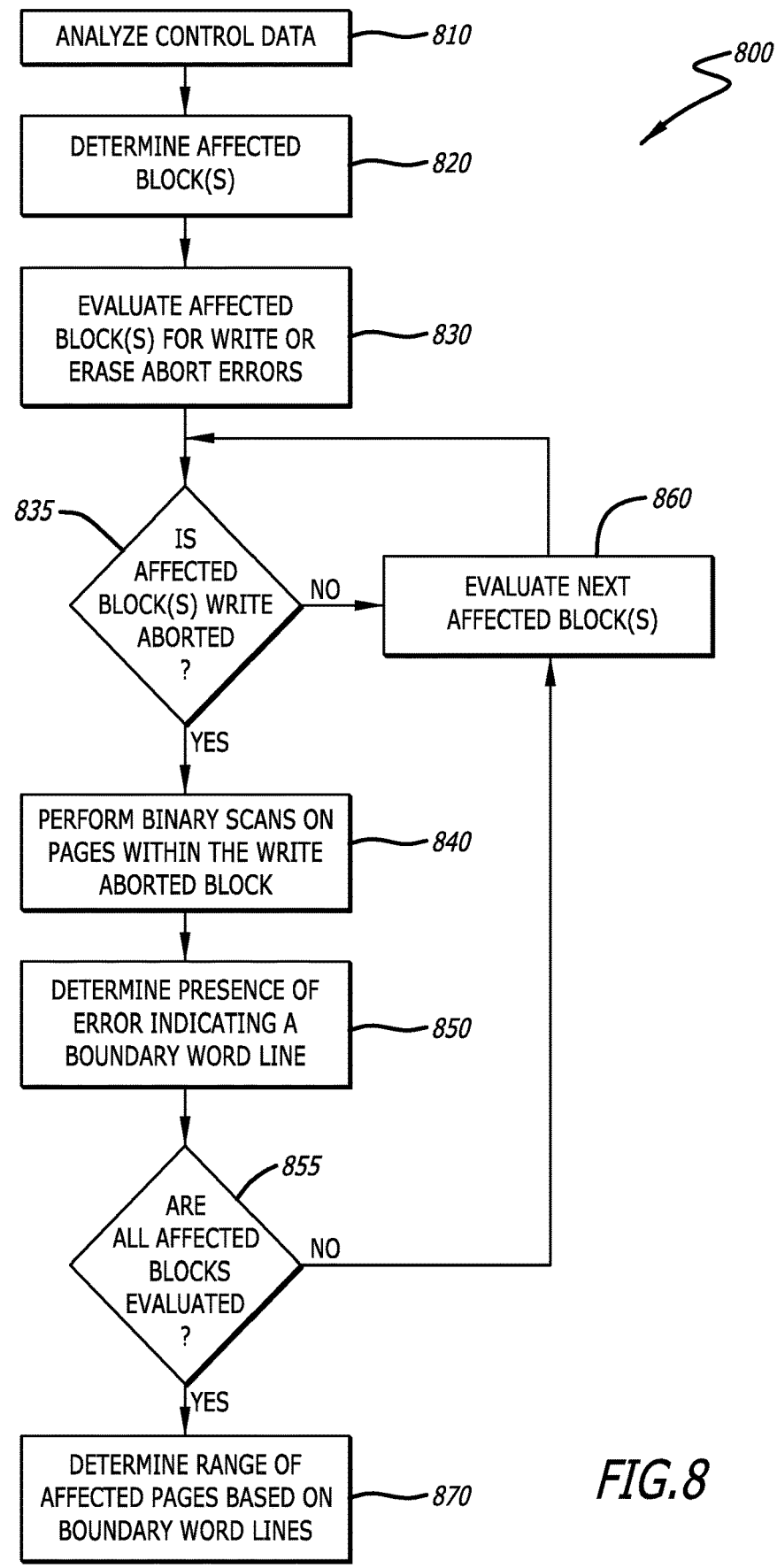
FIG. 8 is a flowchart depicting a process for determining a range of affected pages within a storage device based on boundary word lines in accordance with an embodiment of the invention.

Referring to FIG. 8, a flowchart depicting a process 800 for determining a range of affected pages within a storage device based on boundary word lines in accordance with an embodiment of the invention is shown. The process 800 can begin in many embodiments, by analyzing control data stored within the storage device (block 810). Control data may indicate what blocks within the memory devices may be affected by an interrupted data transfer including, but not limited to, an UGSD. It is contemplated that certain embodiments of the process 800 may not have control data to analyze for various reasons or that the available control data is not useful in narrowing down a search for affected blocks.

A determination of the affected blocks can occur based on the analyzed control data (block 820). As discussed above, certain embodiments may not be able to determine the affected block(s) based on the analyzed control data and may instead perform a scan of all (or a target portion of) blocks within the memory devices. In additional embodiments, a storage device may have a variety of different types of memory devices and may focus on scanning only a portion or particular type of memory devices. By way of example, and not limitation, a storage device may comprise a plurality of non-volatile NAND memory devices including single-level cell NAND memory and quad-level cell NAND memory. In these embodiments, the process 800 can determine the affected block(s) by focusing on the quad-level cell NAND memory as the single-level cell NAND memory may not be affected by the write abort error.

The process 800 can evaluate the affected blocks to determine if write or erase abort errors have occurred within the block (block 830). Embodiments of the current invention involve working with blocks that have suffered a write abort. An evaluation can occur to determine if an affected block has been write aborted (block 835). If the block is determined to not comprise a write abort, then the next affected block can be evaluated (block 860). For blocks that are determined to comprise a write abort, a binary scan can be executed on the pages within the block (block 840). In many embodiments, the binary scan will read only the lower page of the write aborted block. Utilizing the binary scan, the process 800 can determine if an error is present indicating that a boundary word line is present within the scanned page (block 850).

A boundary word line can be understood to be a word line that may indicate a beginning or end to a range of pages that have been affected by the write abort error. In other words, in many embodiments, at least one (and in many cases two) word line(s) can exist that have neighboring word lines associated with pages that have not been completely programmed. Typically, the pages associated with boundary word lines are themselves not completely programmed. In a variety of embodiments, the boundary word line can be indicated by determining whether a page is associated with an uncorrectable error correction code ("UECC"). This can be due to an error in the reading of the page by the controller which triggers the error code.

Once the pages within the write aborted block have been scanned and evaluated for the presence of boundary word lines, the process 800 can determine if all of the affected blocks have been evaluated (block 855). If more affected blocks have to be scanned, the process 800 can evaluate the next affected block (block 860). When all affected write aborted blocks have been scanned and evaluated for boundary word lines, the process 800 can then determine a range of pages affected by the write abort error based on the boundary word lines (block 870).

Figure 9:
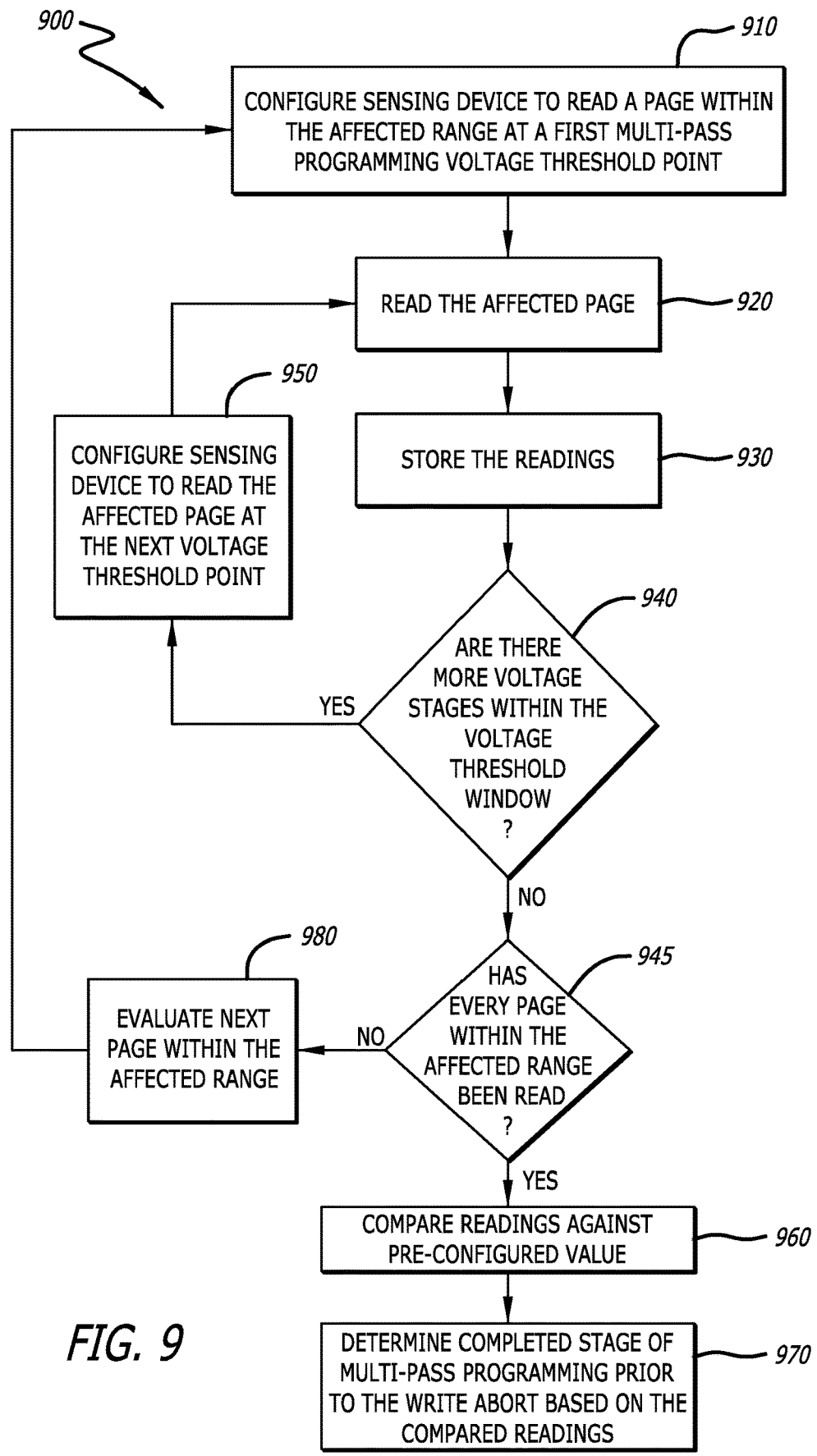
FIG. 9 is a flowchart depicting a process for determining the multi-pass programming stage where the write abort error occurred in accordance with an embodiment of the invention.

Referring to FIG. 9, a flowchart depicting a process 900 for determining the multi-pass programming stage where the write abort error occurred in accordance with an embodiment of the invention is shown. Once a range of affected pages within the storage system have been determined, the process 900 can attempt to further determine the stage wherein the multi-pass programming process was interrupted within the range of affected pages. The process 900 can begin by configuring one or more sensing devices to read the range of affected pages at a first particular voltage threshold point (block 910). In a variety of embodiments, reading is a single-sense read performed by a configurable DAC. In additional embodiments, the DAC can be characterized to read approximately $V_t$ max of the first demarcation read point within the voltage threshold window of a memory cell.

Once configured, the process 900 can read the affected page (block 920). The sensed readings can be stored within the storage device, such as, but not limited to, within a nonvolatile memory device (block 930). A determination can be done if more voltage stages (i.e. demarcation read points) exist within the remaining voltage threshold window (block 940). If more voltage stages exist, the sensing device can be further configured to read the affected page at the next available voltage threshold point (block 950). Once all of the available voltage threshold points have been read and their corresponding readings stored, the process 900 can verify that all of the pages within the affected range have been read (block 945). If more affected pages within the range exist, the process 900 can move to the next affected page before continuing to read the plurality of voltage threshold points within the available voltage threshold window (block 980).

When all affected pages within the determined range have been read and the corresponding readings stored, the process 900 can compare the stored readings against a pre-configured value (block 960). As will be recognized by those skilled in the art, the stored readings and pre-configured value can be utilized as a variety of formats. In certain embodiments, the readings can be converted from raw sensed readings into other data (such as Boolean/alphanumeric data, or other data structures) that may be compared against a similar formatted data. The output of the comparison can be utilized by the process 900 to determine what competed stage of the multi-pass programming was completed prior to the write abort error (block 970).

By way of an illustrative but non-limiting example, a memory device similar in structure to the memory device illustrated in FIG. 6 may have suffered a sudden power loss causing a UGSD during step 6 of the foggy/fine multi-pass programming. In this example, the affected range of boundary word lines would be WL0 and WL1. After scanning each page, it would be determined from the stored readings that WL0 comprises one string (String 0) that has been programmed completely and is not producing errors, and three strings (String 1-3) that have been foggy programmed, but not fine programmed (and are thus non-erased, but non-readable). Conversely, WL1 readings can indicate two strings (String 0-1) that have been foggy programmed, and two strings (String 2-3) that appear as erased. Based on this data, the process may compare this data against a table of preconfigured values which indicates that this set of erased strings, foggy programmed strings, and fine programmed strings over these two boundary word lines indicate that the write abort error occurred during the $6^{th}$ step of the multi-pass programming operation.

Figure 10:
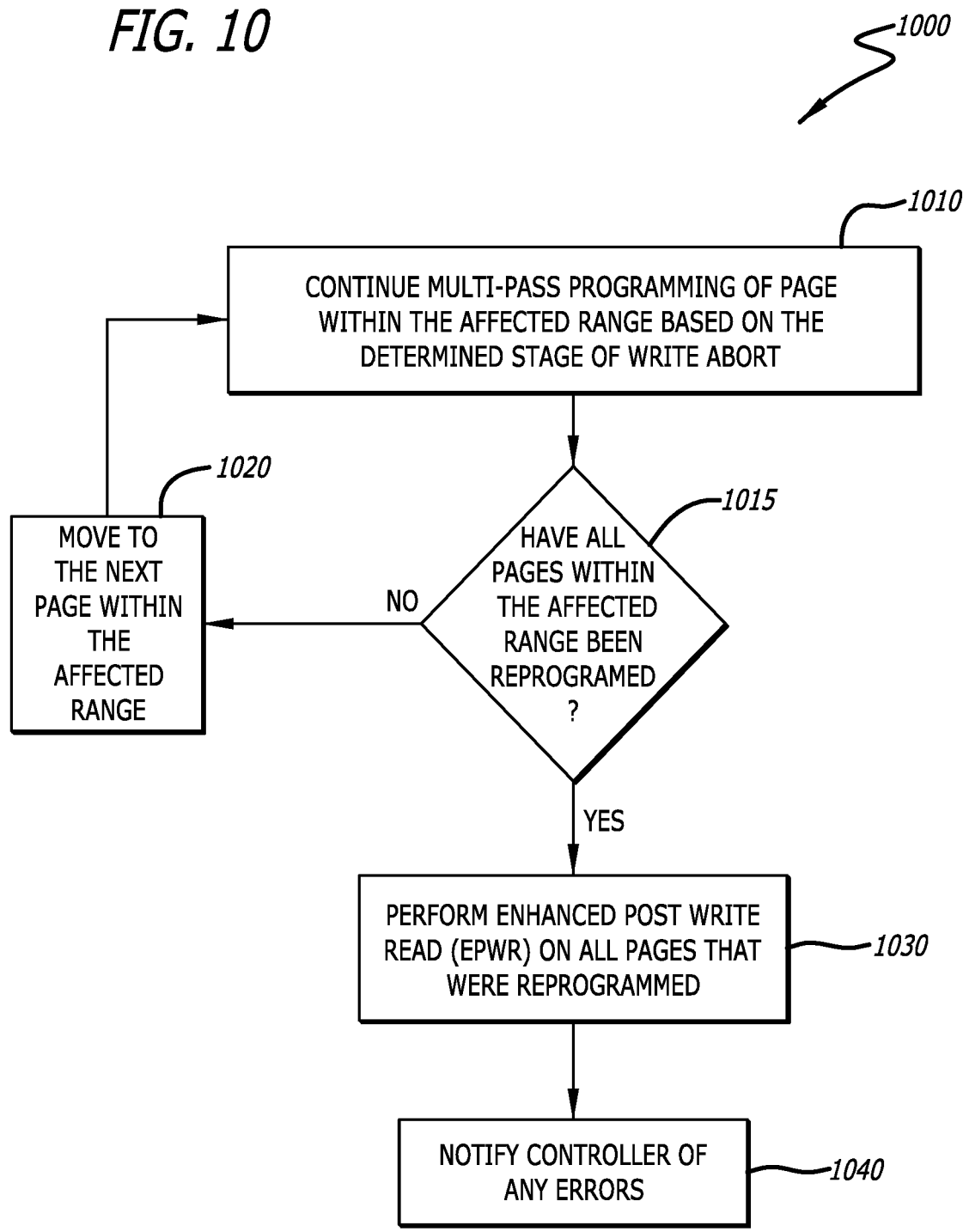
FIG. 10 is a flowchart depicting a process for reprogramming pages that were affected by a write abort error in accordance with an embodiment of the invention.

Referring to FIG. 10, a flowchart depicting a process 1000 for reprogramming pages that were affected by a write abort error in accordance with an embodiment of the invention is shown. Once the specific stage within the multi-pass program has been determined, the process 1000 can continue the programming of the affected range of pages in order to complete the original data transfer (block 1010). In many embodiments, this may be programming pages within a string with fine programming after it was determined that the foggy programming was previously completed prior to the write abort error. In further embodiments additional passes may occur based on the readings obtained by sensing the affected pages indicating only an intermediate step had completed during the multi-pass programming.

Once reprogramming of the page is complete, the process 1000 can determine if all pages within the affected range been reprogrammed (block 1015). Upon determination that more pages within the affected range exist, the process 1000 can move to that next page to continue reprogramming (block 1020). When all pages within the affected range have been reprogrammed, the process 1000 can perform an enhanced post write read ("EPWR") on all pages that were reprogrammed (block 1030). In some embodiments, the EPWR can provide more detailed information regarding the state of the memory device and occurs directly after the reprogramming and before continuation of the remainder of the aborted data transfer. In certain embodiments, the EPWR may occur after the aborted transfer is completed. It is contemplated that this decision may be interchangeable depending on the demands of the host-computing and/or storage device controller environment.

In some instances, even after reprogramming, it may occur that one or more memory cells are unreliable or otherwise produce errors. The process 1000 can notify the controller within the storage device of these errors (block 1040). In a number of embodiments, the EPWR will produce an error that indicates a bad memory cell. The storage device controller may decide to attempt to reprogram the memory cell or to consider it corresponding block a "bad block" and refrain from utilizing it in the future. In most embodiments, once the process 1000 has notified the controller of errors, the controller may respond by resuming normal operations of the storage device.

Furthering the illustrative example described in the discussion of FIG. 9, after determining that the write abort error occurred during the staggered step 6 of the foggy/fine multi-pass program, the process 1000 may verify that the foggy programming of the 6$^{th}$ step was completed and if not, provide further programming to finalize it. Then, the programming would continue onto step 7 and onward until the end of the programming (FIG. 9 step 767). The pages associated with WL0 and WL1 would undergo EPWR testing to verify any errors with the store data.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A storage device, comprising:
a controller configured to direct the storage device to:
utilize a multi-pass programming method to store data within a plurality of memory devices within the storage device;
detect one or more errors during data transfer; and
wherein, upon detection of one or more errors, the storage device is directed to:
evaluate blocks within the plurality of memory devices for write abort errors;
scan pages within the evaluated blocks utilizing a binary scan to locate a boundary word line, wherein a scanning pages includes scanning only a lower page of a write aborted block;
determine a range of pages within the plurality of memory devices based on the at least one boundary word line;
determine the stage of multi-pass programming achieved prior to the write abort on each page within the determined range of pages;
continue the previously aborted multi-pass programming of each page within the determined range of pages; and
wherein when all aborted pages within the determined range have been read, the corresponding readings are stored within the storage device and compared against a pre-configured value.

2. The storage device of claim 1, wherein, upon detection of one or more errors, the storage device is further directed to complete the data transfer and verify the programmed data within the determined range of pages.

3. The storage device of claim 2, wherein the verification of the programmed data is achieved utilizing an enhanced post-write read (EPWR).

4. The storage device of claim 2, wherein the storage device is further directed to notify the controller of any pages with non-verifiable data.

5. The storage device of claim 4, wherein in response to being notified of non-verifiable data, the controller further designates the memory structure associated with the non-verifiable data as unusable.

6. The storage device of claim 1, wherein the storage device is further directed to utilize control data to determine what blocks within the plurality of memory devices to scan for write abort errors.

7. The storage device of claim 1, wherein an uncorrectable error correction code is utilized to determine a boundary word line.

8. The storage device of claim 1, wherein the determination of the stage of multi-pass programming achieved on each page prior to the write abortion further includes performing multiple single-sense reads on a plurality of memory cells associated with each page within the determined range of pages.

9. The storage device of claim 8, wherein the each of the multiple single-sense reads are configured for a plurality of voltage thresholds.

10. The storage device of claim 9, wherein the plurality of voltage thresholds corresponds to the plurality of maximum voltage threshold stages within a voltage threshold window of the sensed page.

11. The storage device of claim 10, wherein the sensed reads are compared against a preconfigured value to determine the stage of multi-pass programming achieved prior to the write abortion.

12. The storage device of claim 11, wherein the preconfigured value is associated with a memory cell population within the sensed page.

13. The storage device of claim 1, wherein at least some of the plurality of memory devices are quad-level cell NAND memory devices.

14. A method for completing a write-aborted data transfer within a storage device, comprising:
   starting a data transfer;
   detecting at least one data transfer error during a stage of multi-pass programming of data within a plurality of memory devices;
   evaluating blocks within the plurality of memory devices for write abort errors;
   scanning pages within the evaluated blocks utilizing a binary scan to locate a boundary word line, wherein the scanning pages includes scanning only a lower page of a write aborted block;
   determining a range of pages within the plurality of memory devices based on the at least one boundary word line;
   determining the stage of multi-pass programming achieved prior to the write abort on each page within the determined range of pages; and
   continuing the previously aborted multi-pass programming of each page within the determined range of pages;
   completing the data transfer; and
   wherein when all aborted pages within the determined range have been read, the corresponding readings are stored within the storage device and compared against a pre-configured value.

15. The method of claim 14, wherein one or more parameters associated with the determined range of pages are adjusted prior to continuing the previously aborted multi-pass programming.

16. The method of claim 15, wherein the at least one data transfer error includes an ungraceful shutdown.

17. The method of claim 16, wherein the ungraceful shutdown occurs due to a sudden loss of power.

18. The method of claim 17, wherein the method continues after a re-initialization of the storage device caused by an ungraceful shutdown.

19. A storage device, comprising:
   a plurality of single-level cell NAND memory devices;
   a plurality of increased cell density NAND memory devices;
   a controller configured to direct the storage device to:
      begin a data transfer from the plurality of single-level cell NAND memory devices to the plurality of increased cell density NAND memory devices;
      utilize a multi-pass programming method to store data within the plurality of increased cell density memory devices;
      detect one or more errors during data transfer; and
      wherein, upon detection of the one or more errors, the storage device is further directed to:
         evaluate blocks within the plurality of increased cell density NAND memory devices;
         scan pages within the evaluated blocks utilizing a binary scan to indicate at least one boundary word line, wherein a scanning pages includes scanning only a lower page of a write aborted block;
         determine a range of pages within the plurality of increased cell density NAND memory devices based on the at least one boundary word line;
         determine the stage of multi-pass programming achieved prior to the write abort on each page of the determined range of pages;
         continue the previously aborted multi-pass programming of each page within the determined range of pages;
         complete the data transfer from the plurality of single-level cell NAND memory devices to the plurality of increased cell density NAND memory devices; and
         wherein when all aborted pages within the determined range have been read, the corresponding readings are stored within the storage device and compared against a pre-configured value.

* * * * *